(12) United States Patent
Iorga et al.

(10) Patent No.: US 6,642,707 B1
(45) Date of Patent: Nov. 4, 2003

(54) HIGH-SPEED PEAKING CIRCUIT FOR CHARACTERISTIC IMPEDANCE CONTROL

(75) Inventors: Cosmin Iorga, Oak Park, CA (US);
Alan B. Hussey, Oak Park, CA (US);
Gary Evans, Oak Park, CA (US);
Lucian Maria, Newbury Park, CA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 09/661,073

(22) Filed: Sep. 13, 2000

(51) Int. Cl.[7] .......................... G01R 31/00; H03H 11/28
(52) U.S. Cl. ........................ 324/158.1; 324/765; 326/30
(58) Field of Search ............................... 324/600, 158.1, 324/765; 364/571.01; 714/700; 327/165, 167, 168; 333/138, 139, 32; 326/30, 82, 86, 90

(56) References Cited

U.S. PATENT DOCUMENTS

| | | | | | |
|---|---|---|---|---|---|
| 1,675,460 A | * | 7/1928 | Nyquist | ...................... | 333/138 |
| 3,584,310 A | * | 6/1971 | Hochfelder et al. | ........ | 327/166 |
| 4,253,065 A | * | 2/1981 | Wyman et al. | ............. | 327/292 |
| 4,523,312 A | * | 6/1985 | Takeuchi | ..................... | 714/700 |
| 4,827,437 A | * | 5/1989 | Blanton | .................. | 364/571.01 |
| 4,908,576 A | * | 3/1990 | Jackson | ................... | 324/158.1 |
| 5,955,890 A | | 9/1999 | Gillette | | |
| 6,133,725 A | * | 10/2000 | Bowhers | .................. | 324/158.1 |
| 6,275,023 B1 | * | 8/2001 | Oosaki et al. | ........... | 324/158.1 |

* cited by examiner

Primary Examiner—Ernest Karlsen
(74) Attorney, Agent, or Firm—Lance Kreisman

(57) ABSTRACT

A high-speed tester channel architecture is disclosed for delivering and receiving signals to and from a device-under-test. The tester channel architecture includes drive/compare circuitry having respective driver and comparator transmission line paths and backmatch resistor circuitry to establish a backmatch condition. Peaking circuitry is disposed in each of the driver and comparator transmission line paths. The peaking circuitry includes a capacitive branch and an inductive branch operative to preserve the backmatch condition.

6 Claims, 3 Drawing Sheets

HIGH-SPEED PEAKING CIRCUIT FOR CHARACTERISTIC IMPEDANCE CONTROL

FIELD OF THE INVENTION

The invention relates generally to automatic test equipment for testing semiconductor devices, and more particularly a high-speed peaking circuit for a semiconductor tester channel architecture.

BACKGROUND OF THE INVENTION

The performance of a computer system often relies heavily on the relative speeds of the processor and the supporting memory. Conventional memory devices such as dynamic random access memory (DRAM) currently operate at around 125 MHz, while personal computer processors typically operate in the range from 250 MHz to over 1 Gigahertz. New memory technologies that improve upon conventional DRAM, such as double-data-rate DRAM, SDRAM, and Rambus DRAM promise to increase memory processing speeds up to and beyond 800 Mhz to bridge the performance gaps between memory devices and processors.

In order to test semiconductor devices that employ high-speed memory technology, or that are adapted to interface with such technology, semiconductor device manufacturers employ sophisticated automatic test equipment (ATE). The ATE must be able to generate high speed test waveforms, apply the waveforms to individual device pins, and capture the outputs from the device-under-test (DUT) for analysis to expected results.

Referring generally to FIG. 1, the ATE tester signals are usually generated by drivers 12 to propagate along carefully controlled fifty-ohm transmission lines to corresponding pins of a device-under-test (DUT) 13. To properly match the fifty-ohm transmission lines, the comparator and driver circuitry employ a fifty-ohm backmatch resistance. The output signals from the DUT propagate back to the tester along another set of transmission lines and are captured by comparators 14. The driver/comparator circuitry is often termed the "pin electronics", and mounted on channel cards. The channel cards may include, for example, up to eight channels corresponding to eight device-under-test (DUT) pins. FIG. 1 illustrates a block diagram of a generalized single channel architecture. For a 512 pin device, 64 channel cards may be employed. General background information relating to conventional testers and pin electronics may be found in U.S. Pat. Nos. 5,566,188 and 5,321,700.

Straightforward backmatching for large variations in a 50 ohm tester transmission line has commonly been employed for low-speed tester applications, such as that described in U.S. Pat. No. 5,955,890 to Gillette. The construction in Gillette utilizes a plurality of resistive switches that selectively conduct to maintain a 50 ohm transmission line environment as necessary. Unfortunately, while the Gillette scheme possibly works well for its intended low speed application, for high speed signals each unused switch would possibly create a capacitive "stub", thereby further affecting the signal transmission quality.

While conventional high-performance and high-speed testers have the ability of generating high speed signals approaching 1.6 Gigahertz, the tester signal quality often experiences degradations that affect the pulse-shape as the signal propagates along the transmission line. This degradation may affect the level of the pulse by as much as ten percent. For example, FIG. 2 illustrates how minor variations in the characteristic impedance of the transmission line causes a roll-off of the leading and trailing edges of the tester signal, at 16 (leading edge shown only).

With further reference to FIG. 1, to compensate for the roll-off problem described above, conventional high speed pin electronics include "peaking circuitry" 20 in the form of an RC circuit to introduce a lift in the signal at the leading and trailing edges (shown at 17, in phantom, FIG. 2). While the conventional peaking circuitry substantially improves the roll-off problem, it introduces additional resistance into the transmission line, creating a reflected bump or back-match problem, shown in FIG. 2, at 18 (in phantom) that can affect the tester pulse level by several percent.

What is needed and heretofore unavailable is a circuit for high speed transmission line applications that cooperates with a peaking circuit to fine-tune and maximize tester signal pulse shape characteristics with minimal affect to the characteristic impedance of the tester transmission line. The peaking and backmatch circuit of the present invention satisfies this need.

SUMMARY OF THE INVENTION

The peaking and backmatch circuit of the present invention provides high accuracy semiconductor device testing for high bandwidth applications while minimizing undesirable effects on the characteristic impedance of a high speed tester channel. This correspondingly results in higher tester accuracy and performance.

To realize the foregoing advantages, the invention in one form comprises a high-speed tester channel architecture for delivering and receiving signals to and from a device-under-test. The tester channel architecture includes drive/compare circuitry having respective driver and comparator transmission line paths and backmatch circuitry to establish a backmatch condition. Peaking circuitry is disposed in each of the driver and comparator transmission line paths. The peaking circuitry includes an inductive branch and a capacitive branch disposed in each of the driver and comparator transmission line paths to preserve the backmatch condition while enhancing the tester signal pulse.

In another form, the invention comprises a method of compensating for losses to a tester signal propagating along a driver-terminated transmission line. The method includes the steps of backmatching the transmission line with a backmatch resistance and lifting the leading edge of the signal with peaking circuitry. The peaking circuitry includes inductive branch circuitry and capacitive branch circuitry to preserve the backmatching step.

Other features and advantages of the present invention will be apparent from the following detailed description when read in conjunction with the accompanying drawings.

BRIEF DESCRIPTION OF THE DRAWINGS

The invention will be better understood by reference to the following more detailed description and accompanying drawings in which FIG. is a block diagram of a conventional semiconductor tester channel architecture.

DETAILED DESCRIPTION OF THE INVENTION

High accuracy automatic test equipment relies heavily on the quality, or fidelity, of tester signals applied to devicesunder-test (DUTs), and output signals received from the DUT in order to properly test semiconductor devices. At gigahertz frequencies; the signals exhibit RF characteristics that must be properly recognized. To this end, an optimized tester channel architecture plays an important role in minimizing tester signal degradation from transmission line losses.

Figure 1:
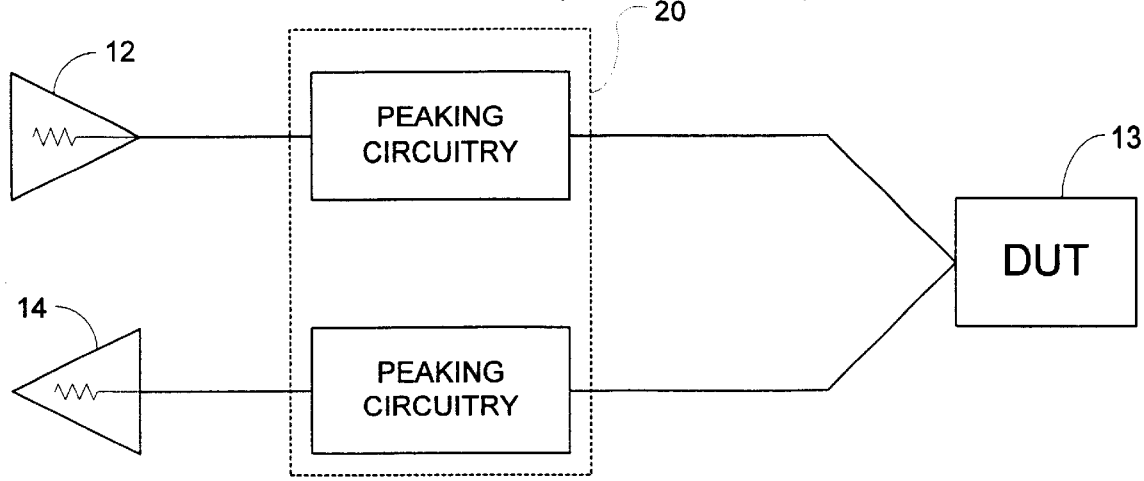
Figure 2:
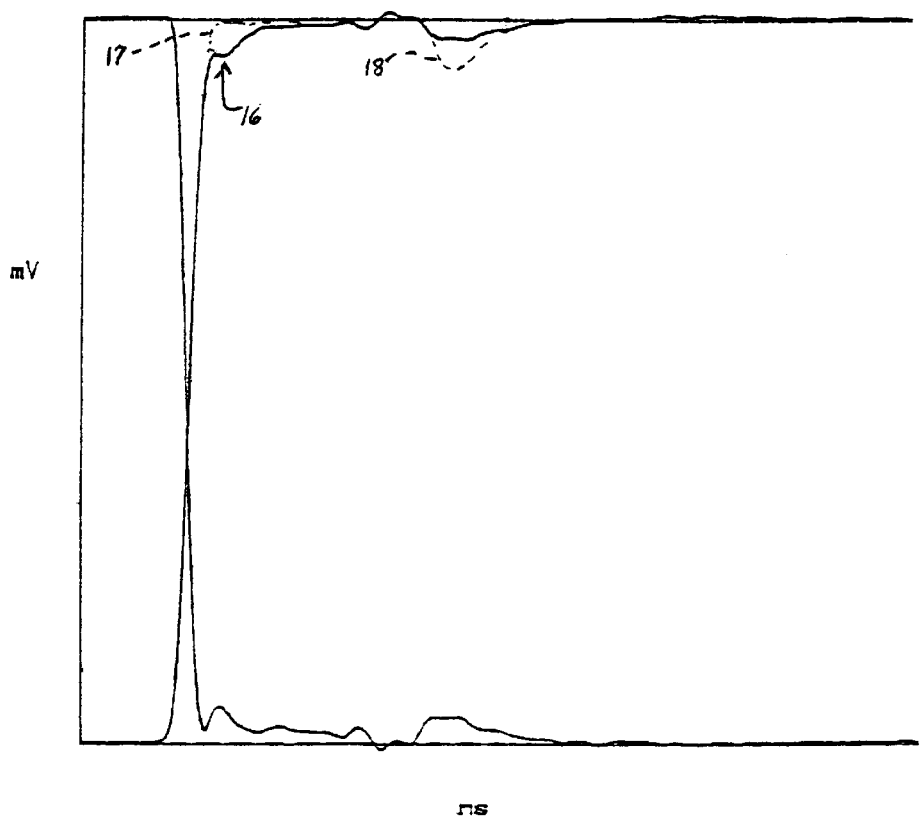
FIG. 2 is a graph illustrating the effects of the conventional peaking circuitry.
Figure 3:
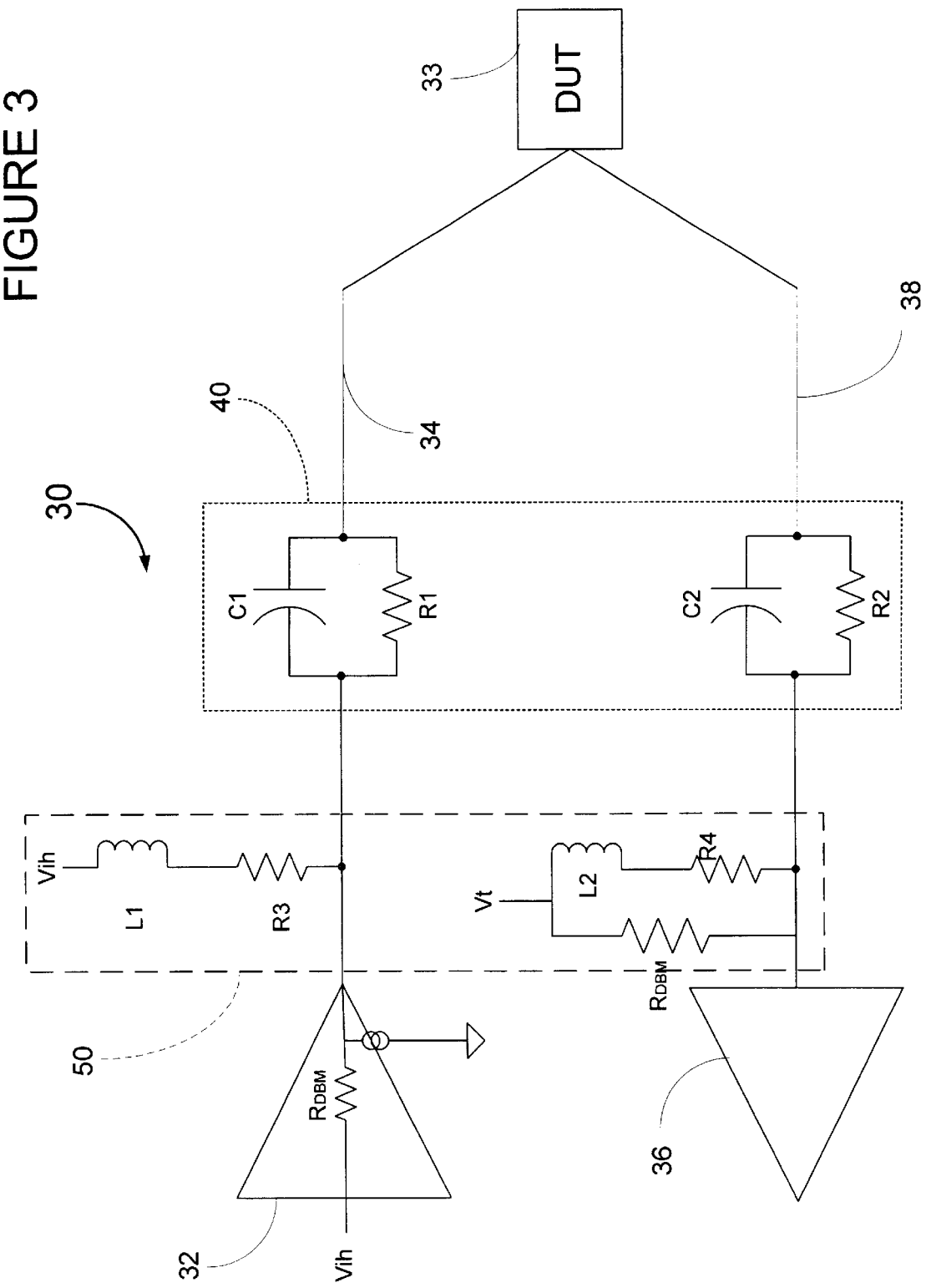
FIG. 3 is a block diagram of the semiconductor tester channel architecture according to one form of the present invention.

With reference to FIG. 3, the semiconductor tester channel architecture of the present invention, generally designated 30, employs peaking circuitry having capacitive branch circuitry 40 and inductive branch circuitry 50 to enable the propagation of high-speed tester signals along a semiconductor tester channel with minimal distortion resulting from characteristic impedance mismatches. This provides optimum waveform fidelity for high-speed tester applications.

Further referring to FIG. 3, the channel architecture 30 includes driver circuitry 32 for driving a tester signal along a first transmission line 34 to a device-under-test (DUT) 33, and comparator circuitry 36 for receiving signals from the DUT 33 along a second transmission line 38. Both the driver circuitry and comparator circuitry include fifty-ohm resistive backmatch circuits to establish a matched condition on the transmission lines. One form of driver circuitry that complements the present invention is closed in pending U.S. patent application Ser. No. 09/253,175,Now U.S. Pat. No. 6,137,318, titled Serial Switch Driver Architecture For Automatic Test Equipment, filed Feb. 19, 1999, expressly incorporated herein by reference, and assigned to the assignee of the present invention.

The transmission lines generally comprise carefully controlled signal paths well known to those skilled in the art with characteristic impedances of fifty ohms. The paths are formed as microstrip traces on the channel cards (not shown) that couple to a tester interface (not shown) via coaxial cables for eventual connection to a multi-layer circuit board, or loadboard (not shown) that mounts the DUT.

With continued reference to FIG. 3, the capacitive branch circuitry 40 is employed on the channel card in both driver and comparator transmission lines 34 and 38, and includes respective parallel RC circuits R1, C1 and R2, C2. Each of the RC circuits are designed to exhibit a predetermined time constant. The choice of components and the time constant is made to optimize the "lift" in the rising edge of the tester pulse and compensate for transmission line losses.

To offset any reflections caused by the capacitive branch circuitry and further referring to FIG. 3, the inductive branch circuitry 50 comprises a pair of LR circuits L1, R3 and L2, R4, each disposed in parallel with the respective capacitive branch RC circuits. The inductor component value is sized to produce an L/R time constant matching that of the RC circuit. Resistors R1 (from the capacitive branch 40) and R3 (from the inductive branch) are chosen according to the formula $R_{BM}=R1+R_{DBM}*R3/(R_{DBM}+R3)$, where $R_{DBM}$ is the driver backmatch resistance value of the backmatch circuitry (typically fifty ohms). A similar relationship holds for resistors R2, R4 and the comparator backmatch resistor $R_{CBM}$.

Figure 4:
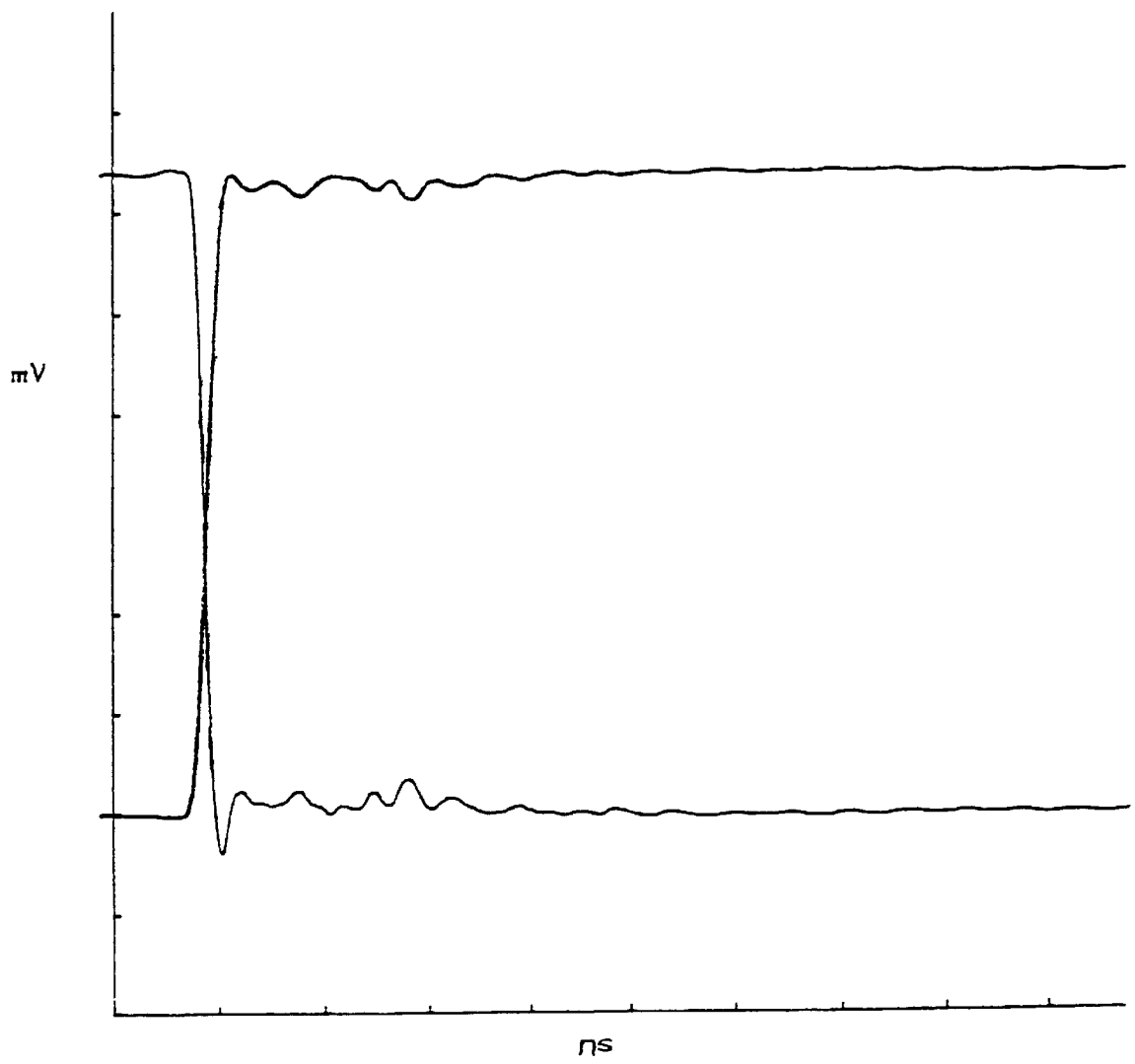
FIG. 4 is a graph illustrating a peaked and backmatched signal propagating along the channel architecture of FIG. 3.

In operation, the tester channel architecture 30 is employed in a multi-channel semiconductor tester having, for example, 1024, 2048 or more channels supported by a plurality of channel cards. Each channel applies signals to, or receives signals from a DUT I/O pin (not shown). As shown in FIG. 4, tester waveforms propagating along each channel exhibit a relatively sharp leading edge (due to the "lifting" effects of the peaking circuitry). This ensures that no "glitches" create a fail condition regarding the proper level of the pulse. Any impedance mismatching caused by the capacitive branch circuitry is neutralized by the inductive branch circuitry, thereby preserving the backmatch condition established by the driver/comparator backmatch resistor circuitry. As a result, tester signals propagating to and from the DUT maintain a high level of accuracy with respect to semiconductor device specifications.

Those skilled in the art will appreciate the many benefits and advantages afforded by the present invention. Of particular importance is the implementation of peaking circuitry with inductive branch circuitry having the same time constant as the capacitive branch circuitry to maximize high-speed waveform fidelity. This provides not only a DC backmatch condition, but also a simultaneous AC backmatch condition. The semiconductor tester is then able to achieve high accuracy by minimizing "ghost" failures due to waveform degradations caused by transmission line losses.

While the invention has been particularly shown and described with reference to the preferred embodiments thereof, it will be understood by those skilled in the art that various changes in form and detail may be made therein without departing from the spirit and scope of the invention. For example, while parallel and series RC and RL branch configurations are illustrated and described, it should be understood that the present invention is in no way limited to any particular parallel or serial interconnection scheme.

What is claimed is:

1. A high-speed tester channel architecture for delivering and receiving signals to and from a device-under-test, said tester channel architecture including:

drive/compare circuitry having respective driver and comparator transmission line paths defining a backmatch condition;

peaking circuitry disposed in each of said driver and comparator transmission line paths, said peaking circuitry including
capacitive branch circuitry, and
inductive branch circuitry, said capacitive and inductive branch circuitry operative to cooperate to preserve said backmatch condition.

2. A high-speed tester channel architecture according to claim 1 wherein:

said capacitive branch circuitry comprises an RC circuit having a predetermined time constant; and said inductive branch circuitry comprises an RL circuit having said predetermined time constant.

3. A high-speed tester channel architecture including:

a drive path having
a first transmission line with a first characteristic impedance;
a driver having an output including a backmatch resistance for establishing a backmatched condition with respect to the transmission line; and
peaking circuitry coupled to the first transmission line, the peaking circuitry comprising a continuous spectrum filter including an RC circuit and an RL circuit, both the RC circuit and the RL circuit having substantially the same time time constant T and configured to preserve the transmission line characteristic impedance.

4. A high-speed tester channel architecture according to claim 3 wherein:

the characteristic impedance is 50 ohms.

5. A high-speed tester channel architecture according to claim 3 and further including a comparator path having a second transmission line with a characteristic impedance;

a comparator having an input coupled to a backmatch resistance for establishing a backmatch condition with respect to the second transmission line; and wherein the peaking circuitry further includes a second RL circuit and a second RC circuit, both the second RL circuit and RC circuits having substantially the same time constants T and configured to preserve the second transmission line characteristic impedance.

6. A high-speed tester channel architecture according to claim 1 wherein:

the RL circuit is an RL shunt with respect to the transmission line; and the RC circuit is disposed in series with the transmission line.

* * * * *